United States Patent [19]

White et al.

[11] Patent Number: 4,951,252

[45] Date of Patent: Aug. 21, 1990

[54] DIGITAL MEMORY SYSTEM

[75] Inventors: William A. White, Garland, Tex.; Albert H. Taddiken, Dallas, both of

[73] Assignee: Texas Instruments Incorporated, Dallas, Tex.

[21] Appl. No.: 262,402

[22] Filed: Oct. 25, 1988

[51] Int. Cl.$^5$ .............................................. G11C 7/00
[52] U.S. Cl. ............................... 365/189.11; 365/190; 365/205
[58] Field of Search ................... 365/154, 189.11, 190, 365/202, 205, 207, 208

[56] References Cited

U.S. PATENT DOCUMENTS 4,665,508 5/1987 Chang .................................. 365/208

Primary Examiner—Joseph A. Popek
Attorney, Agent, or Firm—Ferdinand Romano; René Grossman; Melvin Sharp

[57] ABSTRACT

A digital memory system of the type which includes an amplifier transistor connected to provide an amplified bit line signal corresponding to the state of a selected memory cell. A bit line pull-up transistor is positioned to function as a bit line current source and as a load device for the amplifier transistor. The amplifier transistor is connected between the pull-up transistor and the bit line and an output node positioned between the pull-up and amplifier transistors provides the amplified bit line signal corresponding to the state of a selected memory cell.

14 Claims, 3 Drawing Sheets

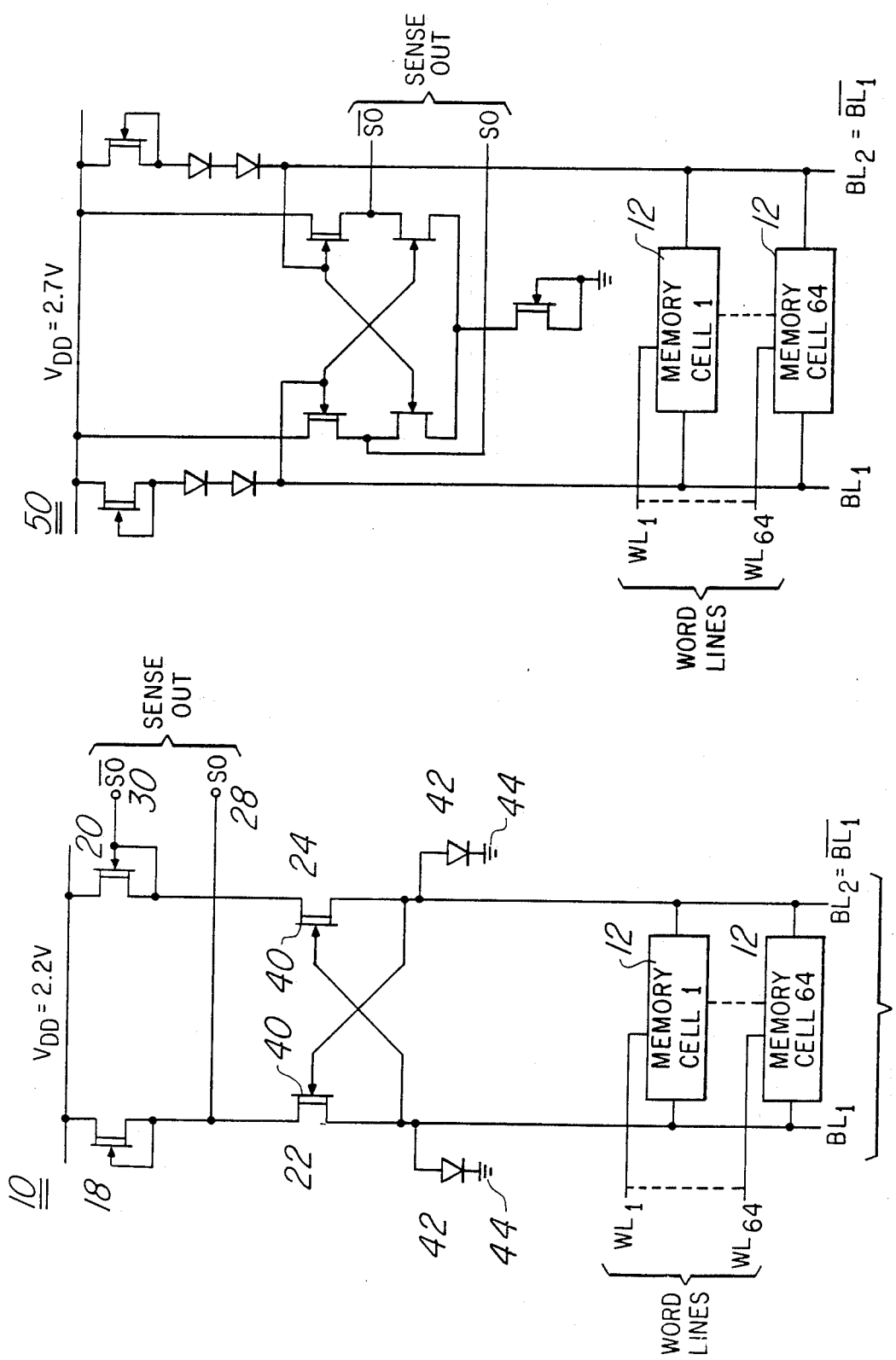

DIGITAL MEMORY SYSTEM

The U.S. Government has a paid-up license in this invention and the right in limited circumstances to require the patent owner to license others on reasonable terms as provided for by the terms of Contract No. F33615-85-C-1797 awarded by the Air Force Wright Aeronautical Laboratories.

FIELD OF THE INVENTION

This invention relates to digital memory systems and, more specifically, to a high speed static random access memory (RAM) system.

BACKGROUND

In high speed static RAM systems such as, for example, one disclosed in U.S. Pat. No. 4,665,508 assigned to the assignee of, the present invention, the typical combination of a high bit line capacitance and a relatively low level of bit line charging current necessitates a low bit line voltage swing. Accordingly, conventional static RAM designs have employed relatively complex and power consumptive circuitry to provide sufficient signal magnification. Even so, sense amplifier gain has been a limiting factor in the speed of memory operations, e.g., reading data out of memory cells. That is, for a given level of amplification a minimum bit line swing voltage must be provided in order to develop a signal of sufficient magnitude to permit proper operation of adjoining circuitry.

The response time, t, for developing a voltage swing, V, is proportional to the voltage, i.e., $$V = It/C$$

where I is the bit line charging current and C is the bit line capacitance. The desire in the art is to minimize the response time in order to provide higher speed memory operation. In the process of increasing the density of static RAM devices it is also desirable to minimize power dissipation as well as the area occupied by the circuit components.

In accordance with the present invention there is provided a digital memory system of the type which includes an amplifier transistor connected to provide an amplified bit line signal corresponding to the state of a selected memory cell. The system overcomes several limitations associated with the above mentioned high speed circuits by including a bit line pull-up transistor positioned to function as a current source for the bit line and as a load device for the amplifier transistor.

In a general form the system includes a column of memory cells and a plurality of word lines connected for selecting a memory cell. A bit line is connected to each memory cell in the column and a bit line pull-up transistor having first, second and third terminals is arranged to form a current source at the second terminal. First and second source/drain electrodes of an amplifier transistor are connected to the second terminal of the pull-up transistor and the bit line respectively. The gate electrode of the amplifier transistor is connected to receive a bias voltage. An amplified bit line signal corresponding to the state of a selected memory cell is available at an output node between the pull-up and amplifier transistors.

The preferred embodiment of the memory system includes first and second bit lines connected to each memory cell in the column. A bit line pull-up transistor and an amplifier transistor are associated with each bit line as described above. An output node between the first pull-up and amplifier transistors provides an amplified bit line signal corresponding to the state of a selected memory cell while a second output node between the second pull-up transistor and the second amplifier transistor provides an amplified bit line signal corresponding to the inverted state of a selected memory cell.

According to the preferred embodiment the gate electrode of the first amplifier transistor is connected to the second source/drain electrode of the second amplifier transistor and the gate electrode of the second amplifier transistor is connected to the second source/drain electrode of the first amplifier transistor. These gate connections provide gate to source voltages in proportion to the difference between voltage levels of the first and second bit lines. Preferably, the first and second pull-up transistors are field effect transistors and the system further includes a diode serially connected between the, bit line and a reference potential.

According to the method disclosed herein high speed static random access memory operation is enhanced by isolating the capacitance of a bit line from the associated bit line pull-up device. Preferably the pull-up device functions as the sense amplifier load as well as the bit line current source to provide faster and simpler operation.

BRIEF DESCRIPTION OF THE DRAWINGS

The invention may best be understood by reference to the detailed description when read in conjunction with the following drawing, wherein:

FIG. 1 provides a partial schematic view of a high speed static RAM device according to the present invention;

FIG. 2 illustrates a memory device based on a conventional sense amplifier design;

Figure 3:
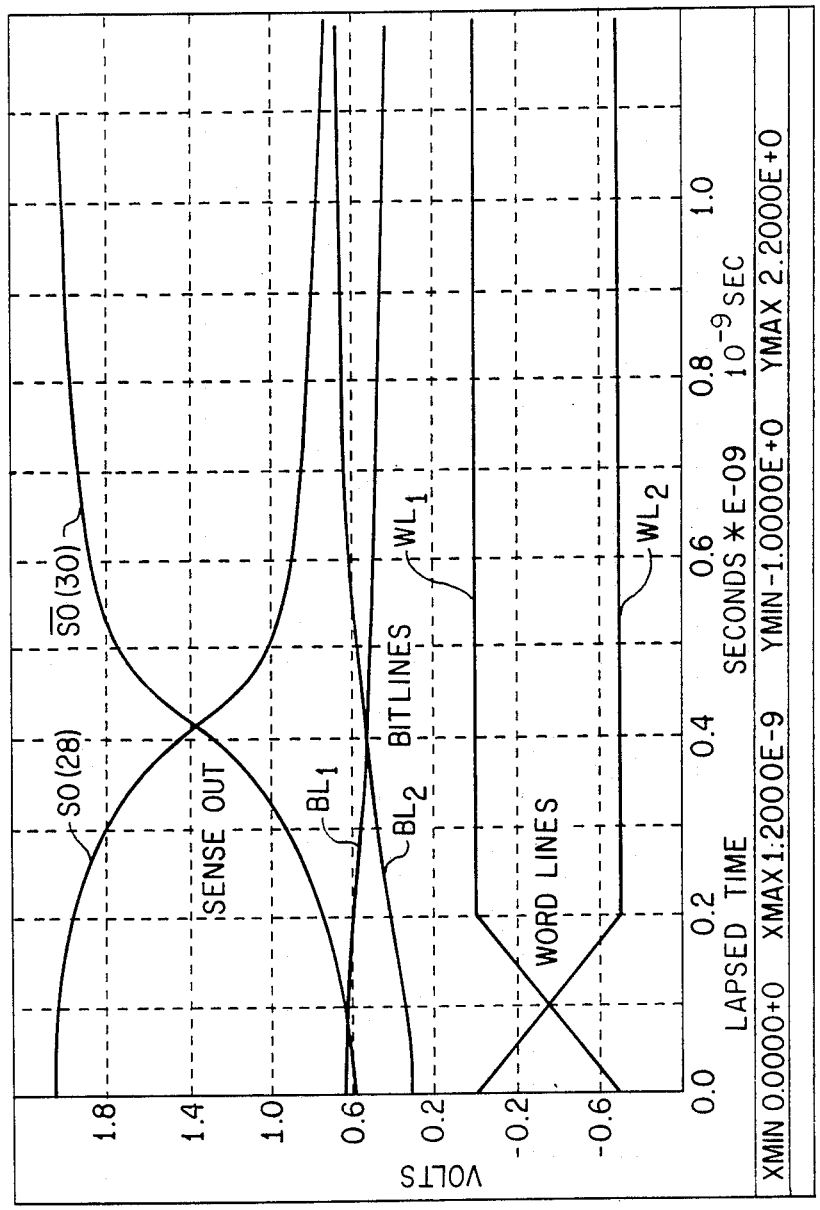
FIG. 3 displays computer simulation results illustrating performance characteristics of a static RAM device constructed according to the invention.

Similar reference numbers are used in various figures to designate similar features and components. Certain preferred embodiments of the invention are disclosed herein. However, it should be appreciated that the specific materials, component arrangements and memory sizes disclosed herein are merely illustrative and do not delimit the scope of the invention.

DESCRIPTION OF THE PREFERRED EMBODIMENT

If the bit line current could be used to generate a sufficiently large signal, a simpler, lower power, faster system would be available. However, as already noted, the speed requirements of high density memories preclude obtaining the full amplitude signal directly from the bit lines. According to the present invention a merged bit line pull-up - sense amplifier circuit provides an impedance transformation, i.e., a current to voltage conversion of the bit line signal. This results in a highly amplified voltage output signal indicative of the state of a selected memory cell.

FIG. 1 is a partial schematic view of a high speed static RAM device 10 comprising a merged bit line pull-up-sense amplifier circuit in conjunction with an exemplary column of 64 memory cells 12. Although the device 10 is presented in simplified form to more clearly describe the invention, it is to be understood that the device includes numerous additional components present in conventional static RAM architecture such as row and column address circuitry, decode logic and output circuitry. See U.S. Pat. No. 4,665,508 which is incorporated by reference.

By way of illustration, the device 10 may be a 4K GaAs MESFET Static RAM containing 4,096 memory cells organized in a 64 row by 64 column array. Decoding may be implemented with a single level of 64 six-input NOR gates. The decoded 6-bit row and column addresses enable the word lines and select a particular column of memory cells. Data are sequentially written into or read out of selected memory cells in accordance with the state of the write enable, data in and chip select signals.

The memory cells 12 illustrated in FIG. 1 may each be, for example, of a conventional six transistor design including two cross-coupled switching transistors, two load transistors and a pair of pass transistors. A plurality of word lines $WL_i$ and bit lines $BL_i$ are connected for memory cell selection. As illustrated in FIG. 1 bit lines $BL_1$ and $BL_2$ are coupled to the memory cells 12 along opposing sides of the column. The bit lines are coupled to a power supply line $V_{DD}$ by bit line pull-up - sense amplifier circuitry which includes a pair of dual function pull-up/load transistors 18 and 20 as well as a pair of amplifier transistors 22 and 24 each positioned between a bit line and one of the dual function transistors 18 or 20.

An amplifier output node 28 or 30 is located between each dual function transistor 18 or 20 and an adjacent amplifier transistor 22 or 24. The amplifier transistors 22 and 24 are positioned to isolate the bit line capacitance from the output nodes 28 and 30. With this isolation each transistor 18 and 20 serves as the load to an adjacent amplifier transistor. The arrangement enables a very fast amplified output to be developed at the output nodes 28 and 30.

As a minimum the circuit only requires four devices to perform both bit line charging and amplification of the otherwise low level bit line signals. In the preferred embodiment the gate electrode 40 of each amplifier transistor 22 and 24 is connected to an opposing bit line and all four transistors 18, 20, 22 and 24 are depletion mode MESFETs. The transistors 18 and 20 are each arranged with the drain electrode coupled to $V_{DD}$ and the gate tied to the source electrode thereby providing a current source. To further limit the high level of the bit line swing voltage, a clamping diode 42 may be serially connected between each bit line and a reference potential 44.

A computer simulation has been carried out to compare the performance of the device 10 with the memory device 50 of FIG. 2, which is based on a conventional sense amplifier design. The device 50 also includes the clamping diodes 42 of the present invention in order to obtain similar voltage swings, this permitting a more objective evaluation of the merged bit line - pull-up circuitry of the present invention. The comparison was performed by reading data out of two adjacent memory cells 12 in a column.

The adjacent cells were initialized to opposite states in order to require reversal of voltages in bit lines $BL_1$ and $BL_2$. That is, simultaneously switching $WL_1$ and $WL_2$ reverses the memory cell selection and causes the bit lines to charge to opposite states. The bit lines were assumed to each include 0.3 pF of capacitance.

Figure 4:
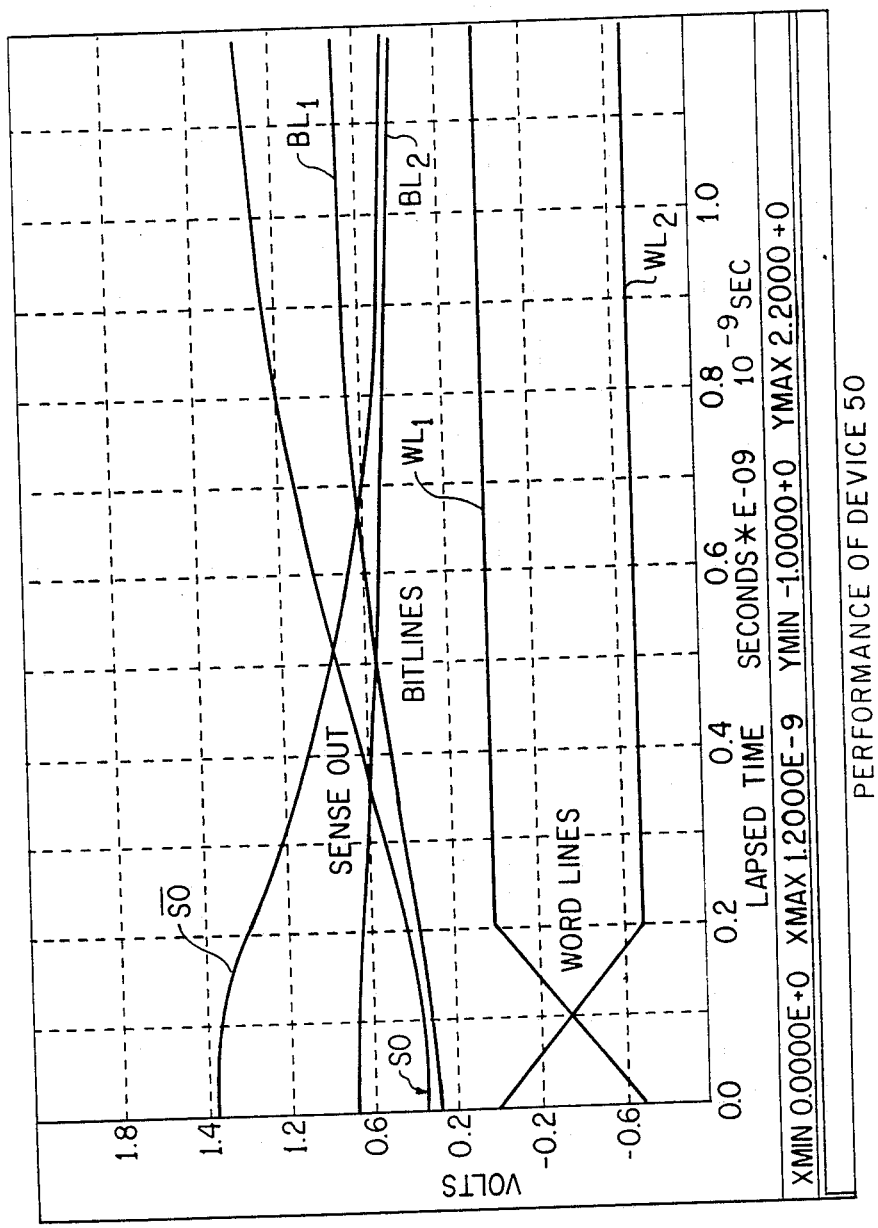
FIG. 4 displays computer simulation results illustrating performance characteristics of a static RAM device based on a conventional sense amplifier design.

The simulation results based on the designs of devices 10 and 50 are illustrated in FIGS. 3 and 4 respectively. In each case the voltage changes in the bit lines $BL_1$ and $BL_2$ and the word lines $WL_1$ and $WL_2$ are plotted along with the amplified Sense Out waveforms SO.

The output waveforms of the device 10, designated in FIG. 3 as SO(28) and $\overline{SO}$(30), exhibit faster and more symmetrical rise and fall times than those of the device 50. For example, lapsed time between the word line and sense out cross points is approximately 0.1 ns shorter for the device 10. The rise time of the device 10 sense out signal, e.g., to 90 percent of the peak to peak value, is also much shorter. Furthermore, in modeling the response time $V_{DD}$ for device 50 was 2.7 volts while $V_{DD}$ for the device 10 was only 2.2 volts. Nevertheless, the output signal of the device 10 was much larger, i.e., approximately 0.5 volts.

The combination of faster rise time and higher gain provide a relatively larger output signal for a given response time. Thus the device 10 is capable of providing output signals of acceptable magnitude faster than the device 50. For example, the device 10 provides a sense out signal of 0.5 volts (as measured from the sense out cross points) in approximately 0.1 ns. In comparison, the device 50 requires greater than a 0.5 ns rise time to develop a 0.5 volt output. Thus higher speed memory operation is attainable with the merged bit line - pull-up circuitry of the present invention.

A corresponding method for enhancing high speed static random access memory operation comprises the step of isolating the capacitance of a bit line from the associated bit line pull-up device. In a preferred form the pull-up device is positioned to function as the sense amplifier load as well as the bit line current source. The result is faster and simpler memory operation.

ADVANTAGES AND MODIFICATIONS

A feature of the preferred embodiment circuit 10 is that the gate electrode 40 of each amplifier transistor 22 and 24 is connected to an opposing bit line. Although the gate bias of each amplifier transistor could be provided with a DC voltage, the cross coupled scheme of FIG. 1 is advantageous for three reasons. First, the coupling eliminates the need for providing an external voltage bias. Second, the amplified signal response times at the output nodes 28 and 30 are nearly symmetrical in comparison to the bit line response. Third, the amplifier sensitivity is approximately doubled because the gate to source voltage of each amplifier transistor is essentially the difference between the two bit line voltages.

In addition to requiring fewer components than conventional memory devices, the designs disclosed herein are more power efficient because the same current that charges the bit lines provides the output signal through a simple impedance transformation.

In alternative embodiments of the invention a single bit line, e.g., $BL_1$, in combination with one pull-up/load transistor 18 and one amplifier transistor 22 provide sufficient gain for RAM operation although a longer response time may be required in order to develop a desired sense out voltage response. The advantages of this embodiment are lower power dissipation and fewer components.

Certain embodiments of the invention have been described. Various other arrangements and configurations of the disclosed embodiments and components thereof will be apparent. For example, while GaAs components may be preferred for high speed operation, other semiconductor materials such a silicon are applicable. To realize advantages of the design principles disclosed herein semiconductor components are not required.

While it is preferred that the transistors 18, 20, 22 and 24 be of equal size, this is not necessary. Nor do the transistors have to be MESFETs. They may, for example, be replaced with MOS, bipolar or other types of devices. All of the devices 18–24 could be high electron mobility transistors (HEMTs). Furthermore, designs incorporating enhancement mode devices are within the scope of substitutions, although these may not provide satisfactory performance. Accordingly, the scope of the invention is only to be limited by the claims which follow.

We claim:

1. A digital memory system comprising:
   at least one column of memory cells;
   a plurality of word lines connected for selecting a memory cell;
   a first bit line connected to each memory cell in the column for determining the state of a selected cell;
   a bit line pull-up transistor having first, second and third terminals, the first terminal connectable to a source of power and the third terminal connected to form a current source at the second terminal;
   an amplifier transistor having first and second source/drain electrodes and a gate electrode, the first source/drain electrode connected to the second terminal of the pull-up transistor, the second source/drain electrode connected to the bit line and the gate electrode connected to receive a bias voltage; and
   an output node between the pull-up and amplifier transistors providing an amplified bit line signal corresponding to the state of a selected memory cell.

2. The system of claim 1 wherein the pull-up transistor is a field effect transistor and the third terminal is a gate electrode.

3. The system of claim 1 wherein the pull-up transistor is a field effect transistor with the first and second terminals being source/drain electrodes and the third terminal being a gate electrode connected to the second terminal.

4. The system of claim 1 further including:
   a second bit line also connected to each memory cell in the column;
   a second bit line pull-up transistor having first, second and third terminals, the first terminal connectable to the source of power and the third terminal connected to form a current source at the second terminal;
   a second amplifier transistor having first and second source/drain electrodes and a gate electrode, the first source/drain electrode connected to the second terminal of the second pull-up transistor, the second source/drain electrode connected to the second bit line and the gate electrode connected to receive a bias voltage; and
   a second output node between the second pull-up transistor and the second amplifier transistor providing an amplified bit line signal corresponding to the inverted state of a selected memory cell.

5. The system of claim 4 wherein:
   the gate electrode of the first amplifier transistor is connected to the second source/drain electrode of the second amplifier transistor; and
   the gate electrode of the second amplifier transistor is connected to the second source/drain electrode of the first amplifier transistor said connections providing gate to source voltages in proportion to the difference between voltage levels of the first and second bit lines relative to a reference potential.

6. The system of claim 5 wherein the first and second pull-up transistors each are a field effect transistor with the first and second terminals being source/drain electrodes and the third terminal being a gate electrode connected to the second terminal.

7. The system of claim 4 wherein the pull-up transistors and the amplifier transistors are GaAs MESFETs.

8. The system of claim 1 wherein the bit line includes a terminal connectable to a reference potential, said system further including a diode serially connected between the terminal and the reference potential.

9. The system of claim 1 wherein the pull up transistors and the amplifier transistor are GaAs MESFETs.

10. A digital memory system comprising:
    at least a first column of memory cells;
    a plurality of word lines connected for selecting a memory cell;
    a plurality of word lines connected for selecting a memory cell;
    a first bit line connected to each memory cell in the column for determining the state of a selected cell;
    an amplifier transistor connected to provide an amplified bit line signal corresponding to the state of a selected memory cell; and
    a bit line pull-up transistor connectable to a source of power and positioned to function as a current source for the bit line and as a load device for the amplifier transistor, said amplifier transistor positioned between said pull-up transistor and said first bit line.

11. The digital memory system according to claim 10 wherein said system is a static random access memory.

12. In a static random access memory device including at least a first column of memory cells, a plurality of word lines and bit lines connected for memory cell selection, a pull-up device and an amplifier transistor coupled to a first bit line, a method for enhancing high speed operation comprising the step of isolating the capacitance of a bit line from the associated bit line pull-up device by positioning the amplifier transistor between the pull-up device and the bit line.

13. The method of claim 12 wherein the step of isolating the bit line capacitance further includes positioning the pull-up device to function as the amplifier transistor load as well as the bit line current source.

14. The method of claim 12 wherein the bit line amplifier transistor is an FET and the device includes a second bit line connected to the first column for memory cell selection, a second pull-up device and a second amplifier transistor coupled to the second bit line, the method further comprising the step of coupling the gate of the first amplifier transistor to the second bit line and coupling the gate of the second amplifier transistor to the first bit line.

* * * * *